US012635285B2

(12) United States Patent
Xin et al.

(10) Patent No.: US 12,635,285 B2
(45) Date of Patent: May 19, 2026

(54) HETEROJUNCTION SOLAR CELL AND PREPERATION METHOD THEREOF

(71) Applicant: ANHUI HUASUN ENERGY CO., LTD., Anhui (CN)

(72) Inventors: Ke Xin, Anhui (CN); Su Zhou, Anhui (CN); Daoren Gong, Anhui (CN); Wenjing Wang, Anhui (CN); Xiaohua Xu, Anhui (CN); Zhigang Mei, Anhui (CN); Long Yang, Anhui (CN)

(73) Assignee: ANHUI HUASUN ENERGY CO., LTD., Xuancheng (CN)

( * ) Notice: Subject to any disclaimer, the term of this patent is extended or adjusted under 35 U.S.C. 154(b) by 158 days.

(21) Appl. No.: 18/574,689

(22) PCT Filed: Jun. 24, 2022

(86) PCT No.: PCT/CN2022/101228

§ 371 (c)(1),
(2) Date: Dec. 27, 2023

(87) PCT Pub. No.: WO2023/274081

PCT Pub. Date: Jan. 5, 2023

(65) Prior Publication Data

US 2024/0297262 A1    Sep. 5, 2024

(30) Foreign Application Priority Data

Jun. 30, 2021    (CN) .......................... 202110735832.8

(51) Int. Cl.
*H10F 77/20* (2025.01)
*H10F 10/164* (2025.01)
(Continued)

(52) U.S. Cl.
CPC ......... *H10F 77/219* (2025.01); *H10F 10/164* (2025.01); *H10F 71/1224* (2025.01);
(Continued)

(58) Field of Classification Search
None
See application file for complete search history.

(56) References Cited

U.S. PATENT DOCUMENTS 9,496,429 B1    11/2016    Erben et al.
2010/0051085 A1 *    3/2010    Weidman .............. H10F 19/908
438/98
(Continued)

FOREIGN PATENT DOCUMENTS

AU    2013326971 A1 *    4/2015    ......... H01L 31/0201
CN    101542639 A    9/2009
(Continued)

OTHER PUBLICATIONS

English language machine translation of CN-109004053-A. (Year: 2025).*

(Continued)

*Primary Examiner* — Eli S Mekhlin
(74) *Attorney, Agent, or Firm* — Maschoff Brennan

(57) ABSTRACT

A heterojunction solar cell and a preparation method therefor. The heterojunction solar cell comprises: a semiconductor substrate layer; and a back composite transparent conductive film located on one side of the semiconductor substrate layer. The back surface composite transparent conductive film comprises: a first back surface transparent conductive film; and a second back transparent conductive film located on the side surface of the first back transparent conductive film facing away from the semiconductor substrate layer. Both the first back transparent conductive film and the second back transparent conductive film are doped with group III heavy atoms, and the concentration of the group III heavy atoms in the second back transparent conductive film is less than that of the group III heavy atoms in the first back transparent conductive film.

16 Claims, 3 Drawing Sheets

(51) Int. Cl.
  H10F 71/00 (2025.01)
  H10F 77/164 (2025.01)
  H10F 77/50 (2025.01)

(52) U.S. Cl.
  CPC ....... H10F 71/138 (2025.01); H10F 77/1645 (2025.01); H10F 77/247 (2025.01); H10F 77/251 (2025.01); *H10F 77/50* (2025.01)

(56) References Cited

U.S. PATENT DOCUMENTS

| | | | |
|---|---|---|---|
| 2012/0270013 A1 | 10/2012 | Kim et al. | |
| 2012/0299142 A1 | 11/2012 | Kanematsu et al. | |
| 2017/0077320 A1 | 3/2017 | Sun et al. | |

FOREIGN PATENT DOCUMENTS

| | | | | |
|---|---|---|---|---|
| CN | 102348827 A | 2/2012 | | |
| CN | 102694066 A | 9/2012 | | |
| CN | 103646972 A | 3/2014 | | |
| CN | 103928082 A | 7/2014 | | |
| CN | 104081534 A | * 10/2014 | ........... | C23C 14/086 |
| CN | 205231076 U | 5/2016 | | |
| CN | 106531835 A | 3/2017 | | |
| CN | 108231928 A | 6/2018 | | |
| CN | 108987488 A | 12/2018 | | |
| CN | 109004053 A | 12/2018 | | |
| CN | 110970523 A | 4/2020 | | |
| CN | 211376648 U | 8/2020 | | |
| CN | 111653644 A | 9/2020 | | |
| CN | 113451429 A | 9/2021 | | |
| EP | 2669952 A1 | 12/2013 | | |
| JP | 2000-150934 A | 5/2000 | | |
| JP | 2013-098390 A | 5/2013 | | |
| JP | 2013-131560 A | 7/2013 | | |
| TW | I578553 B | 4/2017 | | |
| WO | 2010/072462 A1 | 7/2010 | | |

OTHER PUBLICATIONS

English language machine translation of WO 2010/072462 A1. (Year: 2025).*

English language machine translation of CN-104081534-A. (Year: 2025).*

Search Report dated Sep. 19, 2024 for European patent application No. 22831895.2.

First Office Action dated Jan. 30, 2023 for Japanese Patent application No. 2023-581060.

First Office Action dated Jul. 1, 2022 for Chinese Patent application No. 202110735832.8.

Second Office Action dated Mar. 7, 2023 for Chinese Patent application No. 2021107358232.8.

International Search Report and Written Opinion of the International Searching Authority for PCT Patent application No. PCT/CN2022/101228.

Housei Akazawa, "Double layer structures of transparent conductive oxide suitable for solar cells: Ga-doped ZnO on undoped ZnO", Thin Solid Films, vol. 526, Dec. 1, 2012.

* cited by examiner

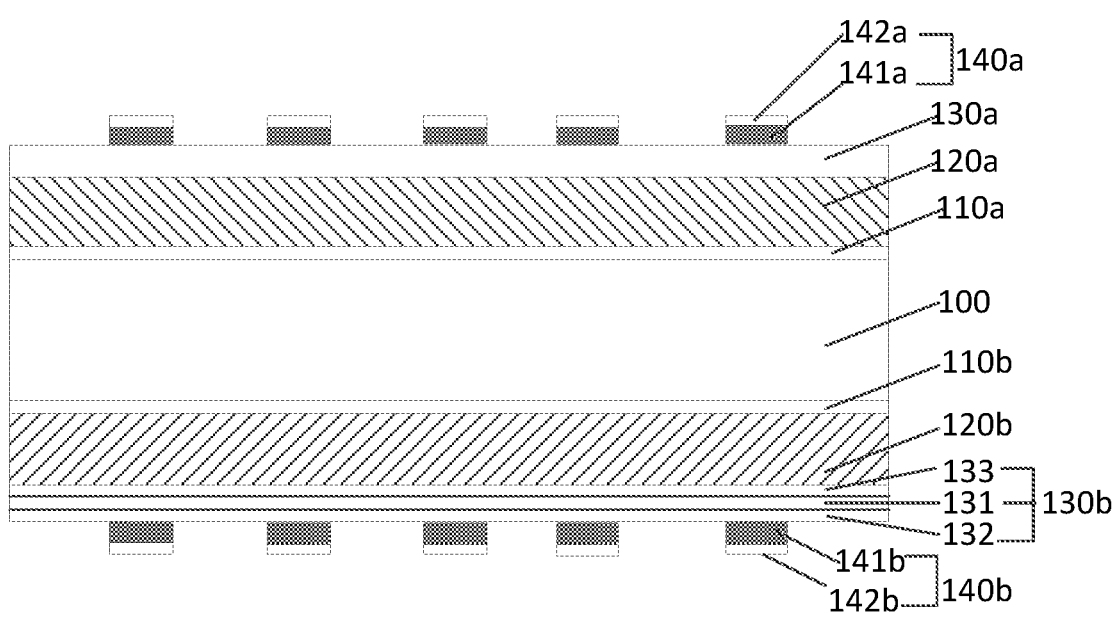
FIG. 1
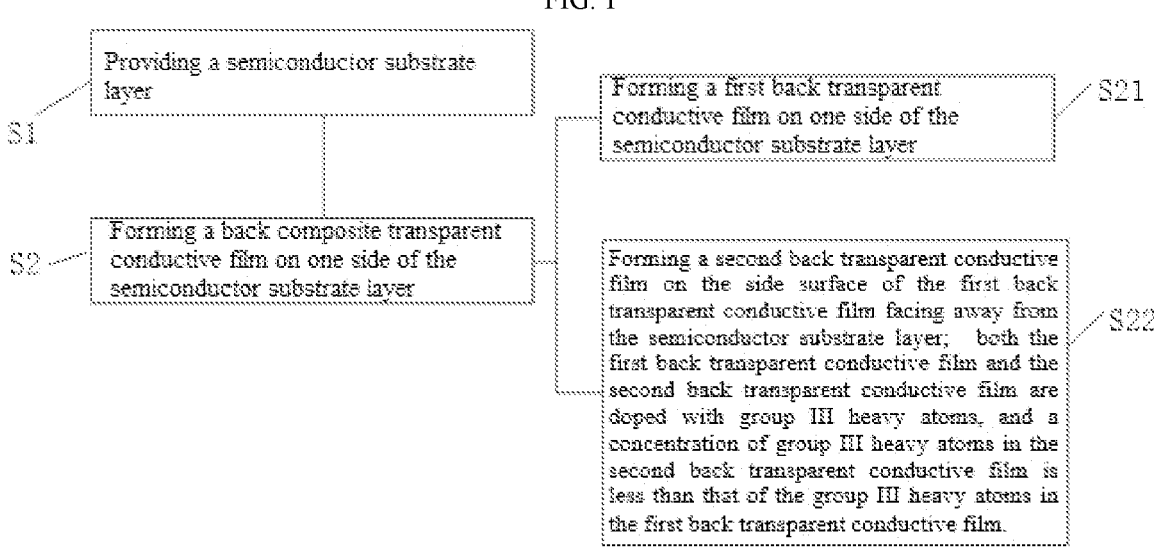
FIG. 2
FIG. 3

HETEROJUNCTION SOLAR CELL AND PREPERATION METHOD THEREOF

CROSS REFERENCE TO RELATED APPLICATIONS

The present application claims priority to Chinese Patent Application No. 202110735832.8, entitled "Heterojunction solar cell and preparation method therefor", and filed to the China National Intellectual Property Administration on Jun. 30, 2021, the entire contents of which are incorporated herein by reference.

TECHNICAL FIELD

The present application relates to the field of photovoltaic cells, in particular to a heterojunction solar cell and preparation method therefor.

BACKGROUND

Solar cells are one kind of clean energy cells, and solar cells are widely used in life and production. Adding a layer of transparent conductive Oxides (TCO) film between the grid of solar cells, especially heterojunction solar cells, and the amorphous silicon layer, can effectively increase the collection of charge carriers and improve the conversion efficiency of solar cells.

The transparent conductive film comprises a front transparent conductive film and a back transparent conductive film. At present, the setting of the transparent conductive film leads to the problems of poor photoelectric conversion efficiency and packaging performance of heterojunction solar cells. For heterojunction solar cells, the optimization of the comprehensive performance of the back transparent conductive film has always been a research hotspot for those skilled in the art.

SUMMARY OF THE INVENTION

Therefore, a technical problem to be solved by the present application is to overcome the problems of poor photoelectric conversion efficiency and encapsulation performance of heterojunction solar cells in the prior art, thereby providing a heterojunction solar cell.

The present application provides a heterojunction solar cell, wherein the heterojunction solar cell comprises a semiconductor substrate layer; and a back composite transparent conductive film located on one side of the semiconductor substrate layer; wherein the back composite transparent conductive film comprises a first back transparent conductive film; and a second back transparent conductive film located on the surface of the side of the first back transparent conductive film facing away from the semiconductor substrate layer; wherein both the first back transparent conductive film and the second back transparent conductive film are doped with group III heavy atoms, and a concentration of group III heavy atoms in the second back transparent conductive film is lower than that of the group III heavy atoms in the first back transparent conductive film.

Optionally, the group III heavy atoms comprise gallium atoms; the material of the first back transparent conductive film comprises gallium-doped zinc oxide; the material of the second back transparent conductive film comprises gallium-doped zinc oxide.

Optionally, a ratio of a mass percentage concentration of gallium in the second back transparent conductive film to a mass percentage concentration of gallium in the first back transparent conductive film is in a range from 1:2 to 1:4.

Optionally; the mass percentage concentration of gallium in the first back transparent conductive film is in a range from 1.5% to 2%; the mass percentage concentration of gallium in the second back transparent conductive film is in a range from 0.5% to 1%.

Optionally, a ratio of a thickness of the second back transparent conductive film to a thickness of the first back transparent conductive film is in a range from 1:4 to 1:3.

Optionally, the thickness of the second back transparent conductive film ranges from 10 nm to 20 nm; the thickness of the first back transparent conductive film ranges from 50 nm to 60 nm.

Optionally, the heterojunction solar cell further comprises an organic encapsulation layer located on the surface of the side of the second back transparent conductive film facing away from the first back transparent conductive film.

Optionally; the back composite transparent conductive film further comprises a third back transparent conductive film, and the work function of the third back transparent conductive film is higher than that of the first back transparent conductive film, and is higher than that of the second back transparent conductive film.

Optionally, the mobility of the third back transparent conductive film is greater than that of the first back transparent conductive film, and is greater than that of the second back transparent conductive film; the concentration of doping ions in the third back transparent conductive film is lower than the concentration of group III heavy atoms in the first back transparent conductive film, and is lower than the concentration of group III heavy atoms in the second back transparent conductive film.

Optionally, the material of the third back transparent conductive film comprises tungsten-doped indium oxide.

Optionally; the mass percentage concentration of tungsten in the tungsten-doped indium oxide is in a range from 0.1% to 0.3%.

Optionally, the ratio of the thickness of the third back transparent conductive film to the thickness of the first back transparent conductive film is in a range from 1:5 to 1:6.

Optionally, the heterojunction solar cell further comprises a back grid line located on the side of the back composite transparent conductive film facing away from the semiconductor substrate layer; the back grid line comprises a first sub-back grid line and a second sub-back grid line located on the surface of the side of the first sub-back grid line facing away from the semiconductor substrate layer: a conductivity of the first sub-back grid line is greater than the conductivity of the second sub-back grid line: the melting point of the second sub-back grid line is lower than that of the first sub-back grid line.

Optionally, the material of the first sub-back grid line comprises copper: the material of the second sub-back grid line comprises tin.

Optionally, the relationship between the thickness of the first sub-back grid line and the second sub-back grid line is in a range from 5:1 to 9:1.

Optionally, the aspect ratio of back grid line ranges from 0.8:2 to 1:2; the width of the back grid line ranges from 9 $\mu$m to 11 $\mu$m, and the height of the back grid line ranges from 4 $\mu$m to 6 $\mu$m.

Optionally, the heterojunction solar cell further comprises a first doped semiconductor layer located between the semiconductor substrate layer and the back composite transparent conductive film; the first doped semiconductor layer is in a nanocrystalline state; or the first doped semiconductor layer is in a microcrystalline state.

Optionally, the concentration of doping ions in the first doped semiconductor layer is in a range from 2E19 atom/cm$^3$ to 8E19 atom/cm$^3$.

Optionally, the heterojunction solar cell further comprises a front composite transparent conductive film located on the side of the semiconductor substrate layer facing away from the back composite transparent conductive film: the material of the front composite transparent conductive film comprises tungsten-doped indium oxide.

Optionally, the heterojunction solar cell further comprises a second doped semiconductor layer located between the semiconductor substrate layer and the front composite transparent conductive film: the second doped semiconductor layer is in a nanocrystalline state; or the second doped semiconductor layer is in a microcrystalline state.

Optionally, the heterojunction solar cell further comprises a front grid line located on the side of the front composite transparent conductive film facing away from the semiconductor substrate layer: the front grid line comprises a first sub-front grid line and a second sub-front grid line located on the surface of the side of the semiconductor substrate layer facing away from the first sub-front grid line: the conductivity of the first sub-front grid line is greater than that of the second sub-front grid line: the melting point of the second sub-front grid line is lower than that of the first sub-front grid line.

Optionally, the material of the first sub-front grid line comprises copper: the material of the second sub-front grid line comprises tin.

Optionally, the relationship between the thickness of the first sub-front grid line and the second sub-front grid line is in a range from 5:1 to 9:1.

Optionally, the aspect ratio of front grid line ranges from 0.8:2 to 1:2: the width of the front grid line ranges from 4 µm to 6 µm, and the height of the front grid line ranges from 2.5 µm to 3.5 µm.

The present application also provides a method for preparing a heterojunction solar cell, wherein the method comprises providing a semiconductor substrate layer; forming a back composite transparent conductive film on one side of the semiconductor substrate layer; wherein a process for forming the back composite transparent conductive film comprises forming a first back transparent conductive film on one side of the semiconductor substrate layer; and forming a second back transparent conductive film on the surface of the side of the first back transparent conductive film facing away from the semiconductor substrate layer; wherein, both the first back transparent conductive film and the second back transparent conductive film are doped with group III heavy atoms, and the concentration of group III heavy atoms in the second back transparent conductive film is lower than that of the group III heavy atoms in the first back transparent conductive film.

Optionally, the process for forming the back composite transparent conductive film further comprises forming a third back transparent conductive film on one side of the semiconductor substrate layer before forming the first back composite transparent conductive film; the third back transparent conductive film being located between the first back transparent conductive film and the semiconductor substrate layer after forming the first back transparent conductive film; the work function of the third back transparent conductive film is higher than that of the first back transparent conductive film, and is higher than that of the second back transparent conductive film.

Optionally, the mobility of the third back transparent conductive film is greater than that of the first back transparent conductive film, and is greater than that of the second back transparent conductive film; the concentration of doping ions in the third back transparent conductive film is lower than that of group III heavy atoms in the first back transparent conductive film, and is lower than that of group III heavy atoms in the second back transparent conductive film.

Optionally, the method further comprises forming a back grid line on the side of the back composite transparent conductive film facing away from the semiconductor substrate layer: the step of forming the back grid line comprises forming a patterned first photoresist layer on the surface of the back composite transparent conductive film, the first photoresist layer has a first grid line opening: forming the back grid line in the first grid line opening by an evaporation process; and removing the first photoresist layer after forming the back grid line in the first grid line opening by the evaporation process.

Optionally, the step of forming the back grid line in the first grid line opening by the evaporation process comprises forming a first sub-back grid line in the first grid line opening by the evaporation process; forming a second sub-back grid line located on the surface of the first sub-back grid line in the first grid line opening by the evaporation process; the conductivity of the first sub-back grid line is greater than that of the second sub-back grid line; the melting point of the second sub-back grid line is lower than that of the first sub-back grid line.

Optionally, the method for preparing a heterojunction solar cell further comprises forming a front composite transparent conductive film on the other side of the semiconductor substrate layer; the material of the front composite transparent conductive film comprises tungsten-doped indium oxide.

Optionally, the method for preparing a heterojunction solar cell further comprises forming a front grid line on the side of the front composite transparent conductive film facing away from the semiconductor substrate layer; the step of forming the front grid line comprises forming a patterned second photoresist layer on the surface of the front composite transparent conductive film, the second photoresist layer has a second grid line opening; forming the front grid line in the second grid line opening by an evaporation process; removing the second photoresist layer after forming the front grid line in the second grid line opening by the evaporation process.

Optionally, the step of forming the front grid line in the second grid line opening by the evaporation process comprises forming a first sub-front grid line in the second grid line opening by using the evaporation process; forming a second sub-back grid line located on the surface of the first sub-back grid line in the first grid line opening by the evaporation process; a conductivity of the first sub-front grid line is greater than that of the second sub-front grid line; a melting point of the second sub-front grid line is lower than that of the first sub-front grid line.

Optionally, the method further comprises forming the first doped semiconductor layer on one side of the semiconductor substrate layer; the first doped semiconductor layer is in a nanocrystalline state; or, the first doped semiconductor layer is in a microcrystalline state; the first doped semiconductor layer being located between the semiconductor substrate layer and the back composite transparent conductive film after forming the back composite transparent conductive film.

Optionally, a process for forming the first doped semiconductor layer comprises a plasma chemical vapor deposition process, and the plasma chemical vapor deposition process comprises the following parameters of: the gases used comprising $H_2$, $SiH_4$, and $B_2H_6$, and a flow ratio of $H_2$ and $SiH_4$ being in a range from 200:1.8 to 200:2.3, a flow ratio of $B_2H_6$ and $SiH_4$ being in a range from 1:1 to 1:5, a chamber pressure being in a range from 0.3 Pa to 0.5 Pa, and a RF power density being in a range from 0.25 mW/cm² to 0.4 m W/cm².

The technical solution of the present application has the following beneficial effects:

1. The heterojunction solar cell provided by the present application comprises a back transparent conductive film, wherein the back transparent conductive film comprises a first back transparent conductive film; and a second back transparent conductive film located on the surface of the side of the first back transparent conductive film facing away from the semiconductor substrate layer, wherein both the first back transparent conductive film and the second back transparent conductive film are doped with group III heavy atoms. Firstly, since the atomic weight of group III heavy atoms is relatively large, the density of the first back transparent conductive film doped with group III heavy atoms becomes larger, the density of the second back transparent conductive film doped with group III heavy atoms becomes larger, the hardness of both the first back transparent conductive film and the second back transparent conductive film becomes larger, and the gallium atoms at the interface between the second back transparent conductive film and the organic encapsulation layer are covered by more C—H bonds of the organic encapsulation layer. That is to say, the gallium atoms at the interface can bind with more C—H bonds, thereby making the bonding force between the second back transparent conductive film and the organic encapsulation layer greater. Secondly, the concentration of group III heavy atoms in the second back transparent conductive film is lower than that of group III heavy atoms in the first back transparent conductive film, and the concentration of group III heavy atoms in the second back transparent conductive film is relatively small, which reduces the surface defect density of the second back transparent conductive film and enhances the bonding force between the second back transparent conductive film and the organic encapsulation layer. Thirdly, the hardness of both the first back transparent conductive film and the second back transparent conductive film becomes larger, which also makes the bonding force between the first back transparent conductive film and the second transparent conductive film greater. In summary, the bonding force between the back composite transparent conductive film and the organic encapsulation layer is enhanced to improve the packaging performance of heterojunction solar cells.

Since the concentration of group III heavy atoms in the first back transparent conductive film is relatively high, the concentration of the free carriers in the first back transparent conductive film is higher. The conductivity of the first back transparent conductive film is superior to that of the second back transparent conductive film, which makes the back composite transparent conductive film have better conductivity, and makes the back composite transparent conductive film have better ability to collect carrier. It is beneficial for improving the photoelectric conversion efficiency of heterojunction solar cells.

2. Further, the group III heavy atoms comprise gallium atoms: the material of the first back transparent conductive film comprises gallium-doped zinc oxide: the material of the second back transparent conductive film comprises gallium-doped zinc oxide. Gallium-doped zinc oxide not only has the advantage of lower price, which reduces the cost of heterojunction solar cells, but also has the advantage of greater mobility, which can improve the conductivity of the first back transparent conductive film and the second back transparent conductive film.

3. Further, the back composite transparent conductive film further comprises a third back transparent conductive film, and a work function of the third back transparent conductive film is higher than that of the first back transparent conductive film, and is higher than that of the second back transparent conductive film. Since the work function of the third back transparent conductive film is relatively high, the bandgap mismatch between the third back transparent conductive film and the first doped semiconductor layer is reduced, that is, the band gap mismatch between the back composite transparent conductive film and the first doped semiconductor layer is reduced, so that the valence band bending of the back composite transparent conductive film to the first doped semiconductor layer is relatively small, which facilitates holes tunneling from the first doped semiconductor layer to the back composite transparent conductive film.

Further, the Fermi level of the third back transparent conductive film will move upward as the concentration of doping ions in the third back transparent conductive film decreases, correspondingly, the work function of the third back transparent conductive film will decrease accordingly. In the present application, the concentration of doping ions in the third back transparent conductive film is lower than the concentration of group III heavy atoms in the first back transparent conductive film, and is lower than the concentration of group III heavy atoms in the second back transparent conductive film, so that the work function of the third back transparent conductive film is relatively high. The mobility of the third back transparent conductive film is greater than the mobility of the first back transparent conductive film and greater than that of the second back transparent conductive film. Since the mobility of the third back transparent conductive film is higher, even the concentration of doping ions in the third back transparent the conductive film is small, which will not make the conductivity of the third back transparent conductive film too small. That is to say, the third back transparent conductive film can still maintain good conductivity, and the contact resistance between the third back transparent conductive film and the first doped semiconductor layer is relatively low.

4. Further, the first doped semiconductor layer is in a nanocrystalline state; or the first doped semiconductor layer is in a microcrystalline state. Secondly, the concentration of doping ions in the first doped semiconductor layer is relatively high, so that the conductivity of the first doped semiconductor layer is improved, and the first doped semiconductor layer has a high doping concentration to improve field passivation, that is to say, the electric field intensity between the first doped semiconductor layer and the first intrinsic semiconductor layer becomes larger, which is better impeding the diffusion of photogenerated electrons to the interface between the first doped semiconductor layer and the first intrinsic semiconductor layer, thereby allowing photogenerated electrons to diffuse to the front of the heterojunction solar cell, and reducing the recombination probability of photo generated carriers. Meanwhile, the volume resistance of the first doped semiconductor layer is reduced, the contact resistance between the first doped semiconductor layer and the back composite transparent conductive film is reduced, the series resistance of hetero-junction solar cells is improved, and the photoelectric conversion efficiency of heterojunction solar cells is improved.

BRIEF DESCRIPTION OF THE DRAWINGS

In order to illustrate the specific embodiments of the present invention or the technical solutions in the prior art more clearly, the following briefly introduces the accompanying drawings that need to be used in the description of the specific embodiments or the prior art. Obviously, the accompanying drawings in the following description are some embodiments of the present application. For those of ordinary skill in the art, other drawings can also be obtained based on these drawings without creative efforts.

FIG. 1 is a schematic structural diagram of a heterojunction solar cell provided by an embodiment of the present application.

FIG. 2 is a flow chart of a forming process of a heterojunction solar cell provided by an embodiment of the present application.

FIG. 3-FIG. 7 are structural schematic diagrams of a manufacturing process of a heterojunction solar cell provided by another embodiment of the present application.

REFERENCE SIGNS

Figures 4, 5, 6:
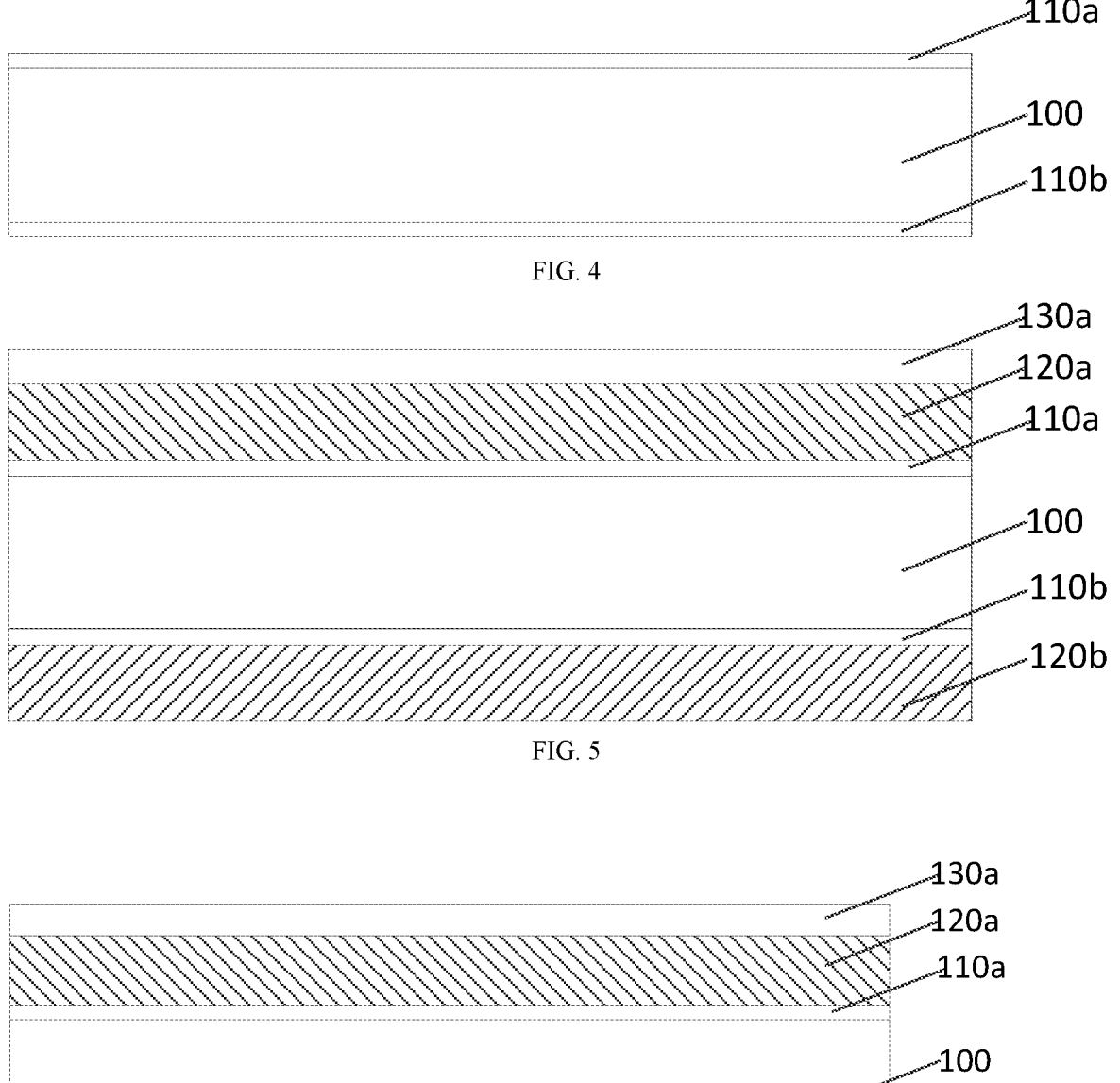

100, semiconductor substrate layer; 110*b*, the first intrinsic semiconductor layer; 110*a*, the second intrinsic semiconductor layer; 130*b*, back composite transparent conductive film; 120*b*, first doped semiconductor layer; 120*a*, the second doped semiconductor layer; 131, the first back transparent conductive film; 132, the second back transparent conductive film; 133, the third back transparent conductive film; 130*a*, the front composite transparent conductive film; 140*b*, the back grid line; 141*b*, the first sub-back grid line; 142*b*, the second sub-back grid line; 140*a*, the front grid line; 141*a*, the first sub-front grid line; 142*a*, the second sub-front grid line.

DETAILED DESCRIPTION

The technical solutions of the present application will be clearly and completely described below in conjunction with the drawings. Obviously, the described embodiments are some of the embodiments of the present application, not all of them. Based on the embodiments in this application, all other embodiments obtained by those skilled in the art without paying creative efforts belong to the scope of protection of the present application.

In the description of the present application, it should be noted that the terms "center", "upper", "lower", "left", "right", "vertical", "horizontal", "inner", "outer" etc. indicated orientation or positional relationship is based on the orientation or positional relationship shown in the drawings, and is only for the convenience of describing the present application and simplifying the description, rather than indicating or implying that the referred device or element must have a specific orientation, use a specific orientation construction and operation, therefore should not be construed as limiting the application. In addition, the terms "first", "second", and "third" are used for descriptive purposes only, and should not be construed as indicating or implying relative importance.

In the description of the present application, it should be noted that unless otherwise specified and limited, the terms "installation", "connected", and "connection" should be understood in a broad sense, for example, it can be fixed connections, removable connections, or integrated connections; it can be mechanically or electrically connected: it can be directly connected, or indirectly connected through an intermediary, or it can be the internal communication of two components, which can be wireless or wired connect. Those skilled in the art can understand the specific meanings of the above terms in the present application in specific situations.

In addition, the technical features involved in the different embodiments of the present application described below may be combined as long as they do not constitute a conflict with each other.

An embodiment of the present application provides a heterojunction solar cell, as shown in FIG. 1, the heterojunction solar cell comprises:

a semiconductor substrate layer 100; and a back composite transparent conductive film 130*b* located on one side of the semiconductor substrate layer 100;

the back composite transparent conductive film 130*b* comprises a first back transparent conductive film 131; and a second back transparent conductive film 132 located on the surface of the side of the first back transparent conductive film 131 facing away from the semiconductor substrate layer 100; wherein both the first back transparent conductive film 131 and the second back transparent conductive film 132 are doped with group III heavy atoms, and a concentration of group III heavy atoms in the second back transparent conductive film 132 is lower than that of the group III heavy atoms in the first back transparent conductive film 131.

In this embodiment, the conductivity type of the semiconductor substrate layer 100 is N-type. It should be noted that, in other embodiments, the conductivity type of the semiconductor substrate layer may also be P-type.

The material of the semiconductor substrate layer 100 comprises single crystal silicon.

Both the first back transparent conductive film 131 and the second back transparent conductive film 132 are doped with group III heavy atoms. Firstly, since the atomic weight of group III heavy atoms is relatively large, the density of the first back transparent conductive film 131 doped with group III heavy atoms becomes larger, the density of the second back transparent conductive film 132 doped with group III heavy atoms becomes larger, the hardness of both the first back transparent conductive film 131 and the second back transparent conductive film 132 becomes larger, and the gallium (Ga) atoms at the interface between the second back transparent conductive film 132 and the organic encapsulation layer are covered by more C—H bonds of the organic encapsulation layer. That is to say, the gallium atoms at the interface can bind with more C—H bonds, thereby making the bonding force between the second back transparent conductive film and the organic encapsulation layer greater. Secondly, a concentration of group III heavy atoms in the second back transparent conductive film 132 is lower than that of group III heavy atoms in the first back transparent conductive film 131, and the concentration of group III heavy atoms in the second back transparent conductive film 132 is relatively low, which reduces the surface defect density of the second back transparent conductive film and enhances the bonding force between the second back transparent conductive film 132 and the organic encapsulation layer. Thirdly, the hardness of both the first back transparent conductive film 131 and the second back transparent conductive film 132 becomes larger, which also makes the bonding force between the first back transparent conductive film 131 and the second transparent conductive film 132 greater. In summary, the bonding force between the back composite transparent conductive film 130b and the organic encapsulation layer is enhanced to improve the packaging performance of heterojunction solar cells.

Furthermore, since the concentration of group III heavy atoms in the first back transparent conductive film 131 is relatively high, the concentration of the free carriers in the first back transparent conductive film 131 is higher. The conductivity of the first back transparent conductive film 131 is superior to that of the second back transparent conductive film 132, which makes the back composite transparent conductive film 130b have better conductivity, and makes the back composite transparent conductive film 130b have better ability to collect carrier. It is beneficial for improving the photoelectric conversion efficiency of hetero-junction solar cells.

In this embodiment, the group III heavy atoms comprise gallium atoms. In this embodiment, the group III heavy atoms do not comprise aluminum atoms. The atomic weight of the group III heavy atoms is greater than or equal to that of gallium atoms.

In one embodiment, the material of the first back trans-parent conductive film 131 comprises gallium-doped zinc oxide; and the material of the second back transparent conductive film 132 comprises gallium-doped zinc oxide.

When the first back transparent conductive film 131 and the second back transparent conductive film 132 are made of zinc oxide-based materials, the price of the zinc oxide-based materials is very cheap, which can significantly reduce the cost of the heterojunction solar cell.

It should be noted that although the price of aluminum (Al)-doped zinc oxide is relatively low, the mobility of aluminum-doped zinc oxide is low, which will reduce the photoelectric conversion efficiency of solar cells. Addition-ally, aluminum-doped zinc oxide has a smaller atomic weight of aluminum and a lower hardness, which will lead to a smaller binding force between aluminum doped zinc oxide and the organic encapsulation layer, which cannot meet the packaging performance requirements of solar cells.

In this embodiment, the binding force between the gal-lium-doped zinc oxide and the organic encapsulation layer is relatively large. Secondly, the mobility of gallium-doped zinc oxide is greater than that of aluminum-doped zinc oxide. Gallium-doped zinc oxide not only has the advantage of lower price, which reduces the cost of heterojunction solar cells, but also has the advantage of greater mobility.

In one embodiment, a ratio of a mass percentage concen-tration of gallium in the second back transparent conductive film 132 to a mass percentage concentration of gallium in the first back transparent conductive film 131 is in a range from 1:2 to 1:4. The advantage is that the first back transparent conductive film 131 is heavily doped, and the conductivity of the first back transparent conductive film 131 has high conductivity: the second back transparent conductive film 132 is moderately doped, and is used to form a good combination with the organic encapsulation layer. Within the above ratio range, the overall conductivity of the back composite transparent conductive film 130b is better, and a good bond is formed between the back composite transpar-ent conductive film 130b and the organic encapsulation layer.

In a specific embodiment, the mass percentage concen-tration of gallium in the first back transparent conductive film 131 is in a range from 1.5% to 2%: the mass percentage concentration of gallium in the second back transparent conductive film 132 is in a range from 0.5% to 1%.

In one embodiment, a ratio of a thickness of the second back transparent conductive film 132 to a thickness of the first back transparent conductive film 131 is in a range from 1:4 to 1:3. The advantage of such a ratio range is that the thickness of the first back transparent conductive film 131 is relatively thick, so that the resistance of the first back transparent conductive film 131 is reduced, and the first back transparent conductive film 131 is used as the main conduc-tive layer of the back composite transparent conductive film 130b. The thickness of the second back transparent conduc-tive film 132 is relatively low, so that the ratio of the thickness of the moderately doped second back transparent conductive film 132 is smaller than the ratio of the thickness of the heavily doped first back transparent conductive film 131. The conductivity of the back composite transparent conductive film 130b is improved.

In a specific embodiment, the thickness of the second back transparent conductive film 132 ranges from 10 nm to 20 nm; the thickness of the first back transparent conductive film 131 ranges from 50 nm to 60 nm. The heterojunction solar cell further comprises an organic encapsulation layer (not shown) located on the surface of the side of the second back transparent conductive film 132 facing away from the first back transparent conductive film 131. The material of the organic encapsulation layer comprises polyolefin copo-lymer (POE), polyethylene-polyolefin-polyethylene com-posite film (EPE) or thermoplastic polyolefin elastomer (TPO).

The heterojunction solar cell further comprises a first doped semiconductor layer 120b located between the semi-conductor substrate layer 100 and the back composite trans-parent conductive film 130b.

The back composite transparent conductive film 130b further comprises a third back transparent conductive film 133, and a work function of the third back transparent conductive film 133 is higher than that of the first back transparent conductive film 131, and is higher than that of the second back transparent conductive film 132. Since the work function of the third back transparent conductive film 133 is relatively high, the band gap mismatch between the third back transparent conductive film 133 and the first doped semiconductor layer 120b is reduced, that is, the band gap mismatch between the back composite transparent con-ductive film 130b and the first doped semiconductor layer 120b is reduced, so that the valence band bending of the back composite transparent conductive film to the first doped semiconductor layer 120b is smaller, which facilitates holes tunneling from the first doped semiconductor layer 120b to the back composite transparent conductive film 130b.

Further, mobility of the third back transparent conductive film 133 is greater than that of the first back transparent conductive film 131, and is greater than that of the second back transparent conductive film 132; a concentration of doping ions in the third back transparent conductive film 133 is lower than the concentration of group III heavy atoms in the first back transparent conductive film 131, and is lower than the concentration of group III heavy atoms in the second back transparent conductive film 132.

The Fermi level of the third back transparent conductive film 133 will move up as the concentration of doping ions in the third back transparent conductive film 133 decreases, correspondingly, the work function of the third back trans-parent conductive film 133 will decrease accordingly. In the present application, the concentration of doping ions in the third back transparent conductive film 133 is lower than the concentration of group III heavy atoms in the first back transparent conductive film 131, and is lower than the concentration of group III heavy atoms in the second back transparent conductive film 132, so that the work function of the third back transparent conductive film 133 is relatively high. The mobility of the third back transparent conductive film 133 is greater than the mobility of the first back transparent conductive film 131 and greater than that of the second back transparent conductive film 132. Since the mobility of the third back transparent conductive film 133 is higher, even the concentration of doping ions in the third back transparent the conductive film 133 is low, which will not make the conductivity of the third back transparent conductive film 133 too small. That is to say, the third back transparent conductive film 133 can still maintain good conductivity, and the contact resistance between the third back transparent conductive film 133 and the first doped semiconductor layer 120*b* is relatively low. In one embodiment, the material of the third back transparent conductive film 133 comprises tungsten-doped indium oxide. The mobility of tungsten-doped indium oxide is greater than that of indium tin oxide, and the work function of tungsten-doped indium oxide is higher than that of indium tin oxide.

In one embodiment, the mobility of the third back transparent conductive film 133 is in a range from 70 $\mu$S/cm$^2$ to 90 $\mu$S/cm$^2$, such as 80 $\mu$S/cm$^2$.

In a specific embodiment, when the material of the third back transparent conductive film 133 is tungsten-doped indium oxide, a mass percentage concentration of tungsten in the tungsten-doped indium oxide is in a range from 0.1% to 0.3%.

In one embodiment, a ratio of the thickness of the third back transparent conductive film 133 to the thickness of the first back transparent conductive film 131 is in a range from 1:5 to 1:6. The advantage is that, since the conductivity of the third back transparent conductive film 133 is less than that of the first back transparent conductive film 131, it is necessary to make the thickness of the third back transparent conductive film 133 as thin as possible, so as to ensure that the back composite transparent conductive film 130*b* has better overall conductivity. Secondly, the thickness of the third back transparent conductive film 133 is relatively thin, which is conducive to maintaining the built-in electric field of the PN junction and maintaining a high open circuit voltage.

In a specific embodiment, the thickness of the third back transparent conductive film 133 ranges from 5 nm to 12 nm, such as 10 nm.

It should be noted that, in this embodiment, since the doping concentration in the first back transparent conductive film 131 is higher than that in the second back transparent conductive film 132, the conductivity of the first back transparent conductive film 131 is greater than that of the second back transparent conductive film 132. The conductivity of the third back transparent conductive film 133 is less than that of the first back transparent conductive film 131, and is greater than that of the second back transparent conductive film 132.

It should be noted that, since the doping concentration in the first back transparent conductive film 131 is higher than that in the second back transparent conductive film 132, and the materials of the first back transparent conductive film 131 and the second back transparent conductive film 132 are the same, so the mobility of the second back transparent conductive film 132 is greater than that of the first back transparent conductive film 131. In a specific embodiment, the mobility of the second back transparent conductive film 132 is in a range from 35 $\mu$S/cm$^2$ to 38 $\mu$S/cm$^2$, and the mobility of the first back transparent conductive film 131 is in a range from 33 $\mu$S/cm$^2$ to 35 $\mu$S/cm$^2$.

It should be noted that the work function of tungsten-doped indium oxide is higher than that of indium tin oxide (ITO).

It should be noted that, in other embodiments, the back composite transparent conductive film 130 *b* only comprises the first back transparent conductive film 131 and the second back transparent conductive film 132, but does not comprise the third back transparent conductive film 133.

The thickness of the back composite transparent conductive film 130*b* ranges from 70 nm to 80 nm, the square resistance of the back composite transparent conductive film 130*b* ranges from 30$\Omega$/square to 60$\Omega$/square, and the back composite transparent conductive film 130*b* has a transmittance greater than 82%. The transmittance of the back composite transparent conductive film 130*b* for light with a wavelength ranging from 350 nm to 1100 nm is greater than 82%.

The heterojunction solar cell further comprises a back grid line 140*b* located on the side of the back composite transparent conductive film 100 facing away from the semiconductor substrate layer 100.

The back grid line 140*b* comprises a first sub-back grid line 141*b* and a second sub-back grid line 142*b* located on the surface of the side of the first sub-back grid line facing away from the semiconductor substrate layer: a conductivity of the first sub-back grid line 141*b* is greater than that of the second sub-back grid line 142*b*: a melting point of the second sub-back grid line 142*b* is lower than that of the first sub-back grid line 141*b*.

In a specific embodiment, the material of the first sub-back grid line 141*b* comprises copper: the material of the second sub-back grid line 142*b* comprises tin. The material of the first sub-back grid line 141*b* is copper, so that the first sub-back grid line 141*b* has better conductivity and at the same time reduces the price. The material of the second sub-back grid line 142*b* is tin, and the melting point of tin is low; which improves the bonding force between the second sub-back grid line 142*b* and the welding ribbon, ensuring the welding effect between the second sub-back grid line 142*b* and the welding ribbon. In summary, the back grid line 140*b* maintains the advantage of low cost and good welding effect.

In one embodiment, a relationship between a thickness of the first sub-back grid line 141*b* and a thickness of the second sub-back grid line 142*b* is in a range from 5:1 to 9:1. In a specific embodiment, the first sub-back grid line 141*b* has a thickness ranging from 4 $\mu$m to 4.5 $\mu$m, and the second sub-back grid line 142*b* has a thickness ranging from 0.5 $\mu$m to 1 $\mu$m. The total thickness of the back grid line 140*b* is in a range from 4 $\mu$m to 6 $\mu$m, such as 5 $\mu$m.

In one embodiment, the back grid line 140*b* has an aspect ratio ranging from 0.8:2 to 1:2. The back grid line has a width ranging from 9 $\mu$m to 11 $\mu$m, and the back grid line has a height ranging from 4 $\mu$m to 6 $\mu$m.

In this embodiment, the first doped semiconductor layer 120*b* is in a nanocrystalline state; or the first doped semiconductor layer 120*b* is in a microcrystalline state. Secondly, the concentration of doping ions in the first doped semiconductor layer 120*b* is relatively high, so that the conductivity of the first doped semiconductor layer 120*b* is improved, and the first doped semiconductor layer 120*b* has a high doping concentration and improves field passivation, that is to say, the electric field intensity between the first doped semiconductor layer 120*b* and the first intrinsic semiconductor layer 110*b* becomes larger, which is better impeding the diffusion of photogenerated electrons to the interface between the first doped semiconductor layer 120*b* and the first intrinsic semiconductor layer 110*b*, thereby allowing photogenerated electrons to diffuse to the front of the heterojunction solar cell, and reducing the recombination probability of photo generated carriers. At the same time, the volume resistance of the first doped semiconductor layer 120*b* is reduced, the contact resistance between the first doped semiconductor layer 120*b* and the back composite transparent conductive film 130*b* is reduced, the series resistance of heterojunction solar cells is improved, and the photoelectric conversion efficiency of heterojunction solar cells is improved. The grain size in the first doped semiconductor layer 120*b* is in a range from 1 nm to 10 nm.

In this embodiment, the material of the first doped semiconductor layer 120*b* is nanocrystalline silicon, or the material of the first doped semiconductor layer 120*b* is microcrystalline silicon.

In one embodiment, a concentration of doping ions in the first doped semiconductor layer 120*b* is in a range from 2E19 atom/cm$^3$ to 8E19 atom/cm$^3$. When the conductivity type of the first doped semiconductor layer 120*b* is P-type, the doping ions in the first doped semiconductor layer 120*b* are P-type ions, such as boron ions.

The crystallization rate of the first doped semiconductor layer 120*b* is in a range from 20% to 80%.

In a specific embodiment, the first doped semiconductor layer 120*b* has a thickness ranging from 7 nm to 14 nm.

In a specific embodiment, the conductivity of the first doped semiconductor layer 120*b* is in a range from $2\times10^{-1}$ S/cm to $8\times10^{-1}$ S/cm.

The heterojunction solar cell further comprises a front composite transparent conductive film located on the side of the semiconductor substrate layer 100 facing away from the back composite transparent conductive film 130*b*; the material of the front composite transparent conductive film 130*a* comprises tungsten-doped indium oxide.

In this embodiment, the front composite transparent conductive film 130*a* has a single-layer structure, and the material of the front composite transparent conductive film 130*a* is tungsten-doped indium oxide, and the mobility of tungsten-doped indium oxide is greater than that of indium tin oxide, therefore, while maintaining a certain resistance of the front composite transparent conductive film 130*a*, the doping concentration in the front composite transparent conductive film 130*a* can be reduced, and a lower doping concentration can reduce the recombination of free carriers. Secondly, a lower doping concentration increases the transmittance of the front composite transparent conductive film 130*a*, specifically increasing the transmittance of light ranging from 700 nm to 1100 nm. Heterojunction solar cells absorb more sunlight, improve the short-circuit current of heterojunction solar cells, and improve the photoelectric conversion efficiency of heterojunction solar cells.

In a specific embodiment, the front composite transparent conductive film 130*a* has a thickness ranging from 70 nm to 80 nm, the front composite transparent conductive film 130*a* has a square resistance ranging from 60Ω/square to 100Ω/square, and the front composite transparent conductive film 130*a* has a transmittance greater than 85%. Specifically, the transmittance of the front composite transparent conductive film 130*a* for light with a wavelength ranging from 350 nm to 1100 nm is greater than 85%.

The heterojunction solar cell further comprises a second doped semiconductor layer 120*a* located between the front composite transparent conductive film 130*a* and the semiconductor substrate layer 100. The conductivity type of the second doped semiconductor layer 120*a* is opposite to that of the first doped semiconductor layer 120*b*. In this embodiment, it is taken as an example that the conductivity type of the second doped semiconductor layer 120*a* is N-type.

The second doped semiconductor layer 120*a* is in a nanocrystalline state; or, the second doped semiconductor layer 120*a* is in a microcrystalline state.

The second doped semiconductor layer 120*a* is in a nanocrystalline state, or the second doped semiconductor layer 120*a* is in a microcrystalline state. Secondly, the concentration of doping ions in the second doped semiconductor layer 120*a* is relatively high, so that the conductivity the second doped semiconductor layer is improved, And the second doped semiconductor layer 120*a* has a high doping concentration to improve field passivation, that is to say, the electric field intensity between the second doped semiconductor layer 120*b* and the second intrinsic semiconductor layer 110*a* becomes larger, which is better impeding the diffusion of photogenerated electrons to the interface between the second doped semiconductor layer 120*a* and the second intrinsic semiconductor layer 110*a*, thereby allowing photogenerated electrons to diffuse to the front of the heterojunction solar cell, and reducing the recombination probability of photo generated carriers. At the same time, the volume resistance of the second doped semiconductor layer 120*a* is reduced, the contact resistance between the second doped semiconductor layer 120*a* and the front composite transparent conductive film 130*a* is reduced, the series resistance of heterojunction solar cells is improved, and the photoelectric conversion efficiency of heterojunction solar cells is improved. The grain size in the second doped semiconductor layer 120*a* is in a range from 1 nm to 10 nm.

A concentration of doping ions in the second doped semiconductor layer 120*a* is in a range from 2E19 atom/cm$^3$ to 8E19 atom/cm$^3$.

The heterojunction solar cell further comprises a front grid line 140*a* located on the side of the front composite transparent conductive film 130*a* facing away from the semiconductor substrate layer 100; the front grid line 140*a* comprises a first sub-front grid line 141*a* and a second sub-front grid line 142*a* located on the surface of the side of the semiconductor substrate layer 100 facing away from the first sub-front grid line 141*a*: the conductivity of the first sub-front grid line 141*a* is greater than that of the second sub-front grid line 142*a*: the melting point of the second sub-front grid line 142*a* is lower than that of the first sub-front grid line 141*a*.

In one embodiment, the material of the first sub-front grid line 141*a* comprises copper: the material of the second sub-front grid line 142*a* comprises tin. The material of the first sub-front grid line 141*a* is copper so that the first sub-front grid line 141*a* has better conductivity while reducing its price. The material of the second sub-front grid line 142*a* is tin, and the melting point of tin is relatively low, which improves the bonding force between the second sub-front grid line 142*a* and the welding ribbon, ensuring the welding effect between the second sub-front grid line 142*a* and the welding ribbon. In summary, the front grid line 140*a* maintains the advantages of low cost and good welding effect at the same time.

In one embodiment, the relationship between a thickness of the first sub-front grid line 141*a* and a thickness of the second sub-front grid line 142*a* is in a range from 5:1 to 9:1. In a specific embodiment, the first sub-front grid line 141*a* has a thickness ranging from 2 μm to 2.5 μm, and the second sub-front grid line 142a has a thickness ranging from 0.5 μm to 1 μm. The total thickness of the front grid line 140a is in a range from 2.5 μm to 3.5 μm, such as 3 μm. The front grid line has a width ranging from 4 μm to 6 μm, and the back grid line has a height ranging from 2.5 μm to 3.5 μm.

It should be noted that, in this embodiment, the thickness of the first sub-front grid line 141a is smaller than that of the first sub-back grid line 141b, in order to increase the transmittance of the front grid line 140a, so that the front of the heterojunction solar energy can receive more sunlight.

In one embodiment, the front grid line has an aspect ratio ranging from 0.8:2 to 1:2.

The heterojunction solar cell further comprises a first intrinsic semiconductor layer 110b located between the first doped semiconductor layer 120b and the semiconductor substrate layer 100; and a second intrinsic semiconductor layer 110a located between the second doped semiconductor layer 120a and the semiconductor substrate layer 100.

Correspondingly, another embodiment of the present application also provides a method for preparing a heterojunction solar cell, referring to FIG. 2, the method comprises the following steps:

S1: providing a semiconductor substrate layer 100;

S2: forming a back composite transparent conductive film 130b on one side of the semiconductor substrate layer 100.

The process for forming the back composite transparent conductive film 130b comprises:

S21: forming a first back transparent conductive film 131 on one side of the semiconductor substrate layer 100;

S22: forming a second back transparent conductive film 132 on the surface of the side of the first back transparent conductive film 131 facing away from the semiconductor substrate layer 100; both the first back transparent conductive film 131 and the second back transparent conductive film 132 are all doped with group III heavy atoms, and a concentration of group III heavy atoms in the second back transparent conductive film 132 is lower than that of group III heavy atoms in the first back transparent conductive film 131.

The process for forming the back composite transparent conductive film 130b further comprises forming a third back transparent conductive film 133 on one side of the semiconductor substrate layer 100 before forming the first back composite transparent conductive film 131: the third back transparent conductive film being located between the first back transparent conductive film 131 and the semiconductor substrate layer 100 after forming the first back transparent conductive film 133; It should be noted that, in this embodiment, the back composite transparent conductive film 130b comprises the first back transparent conductive film 131, the second back transparent conductive film 132 and the third back transparent conductive film 133 as an example. In other embodiments, the back composite transparent conductive film 130b may not comprise the third back transparent conductive film 133.

The method for preparing a heterojunction solar cell will be described in detail below with reference to FIG. 3 to FIG. 7.

Referring to FIG. 3, a semiconductor substrate layer 100 is provided;

Referring to FIG. 4, a first intrinsic semiconductor layer 110b is formed on one side of the semiconductor substrate layer 100, and a second intrinsic semiconductor layer 110a is formed on the other side of the semiconductor substrate layer 100.

Referring to FIG. 5, a first doped semiconductor layer 120b is formed on the side of the first intrinsic semiconductor layer 110b facing away from the semiconductor substrate layer 100; a second doped semiconductor layer 120a is formed on the side of the second intrinsic semiconductor layer 110a facing away from the semiconductor substrate layer 100.

In a specific embodiment, the process of forming the first doped semiconductor layer comprises a plasma chemical vapor deposition process, and the plasma chemical vapor deposition process comprises the following parameters of: the gases used comprising $H_2$, $SiH_4$ and $B_2H_6$, and a flow ratio of $H_2$ and $SiH_4$ being in a range from 200:1.8 to 200:2.3, a flow ratio of $B_2H_6$ and $SiH_4$ being in a range from 1:1 to 1:5, a chamber pressure being in a range from 0.3 Pa to 0.5 Pa, and a RF power density being in a range from 0.25 $mW/cm^2$ to 0.4 m $W/cm^2$.

The concentration of doping ions in the first doped semiconductor layer 120b is in a range from 2E19 atom/cm$^3$ to 8E19 atom/cm$^3$.

In this embodiment, the first doped semiconductor layer 120b is in a nanocrystalline state; or, the first doped semiconductor layer 120b is in a microcrystalline state. Secondly, the concentration of doping ions in the first doped semiconductor layer 120b is relatively high.

In a specific embodiment, the material of the first doped semiconductor layer 120b is nanocrystalline silicon, or the material of the first doped semiconductor layer 120b is microcrystalline silicon.

In this embodiment, the second doped semiconductor layer 120a is in a nanocrystalline state; or, the second doped semiconductor layer 120a is in a microcrystalline state, and secondly, the concentration of doping ions in the second doped semiconductor layer 120a is relatively high. In a specific embodiment, the material of the second doped semiconductor layer 120a is nanocrystalline silicon, or the material of the second doped semiconductor layer 120a is microcrystalline silicon.

The process of forming the second doped semiconductor layer 120a comprises a plasma chemical vapor deposition process.

Referring to FIG. 6, a back composite transparent conductive film 130b is formed on the side of the first doped semiconductor layer 120b facing away from the semiconductor substrate layer 100: a front composite transparent conductive film 130a is formed on the side of the second doped semiconductor layer 120a facing away from the semiconductor substrate layer 100.

The process for forming the back composite transparent conductive film 130b comprises forming a third back transparent conductive film 133 on the side of the first doped semiconductor layer 120b facing away from the semiconductor substrate layer 100: forming a first back transparent conductive film 131 on the surface of the side of the conductive film 133 facing away from the semiconductor substrate layer 100; forming a second back transparent conductive film 132 on the surface of the side of the first back transparent conductive film 131 facing away from the semiconductor substrate layer 100; both the first back transparent conductive film 131 and the second back transparent conductive film 132 are doped with group III heavy atoms, and the concentration of group III heavy atoms in the second back transparent conductive film 132 is lower than that of group III heavy atoms in the first back transparent conductive film 131.

The mobility of the third back transparent conductive film 133 is greater than that of the first back transparent conductive film 131 and greater than that of the second back transparent conductive film 132: the work function of the third back transparent conductive film 133 is higher than that of the first back transparent conductive film 131, and is higher than that of the second back transparent conductive film 132.

The process of forming the first back transparent conductive film 131 comprises a deposition process, such as a plasma chemical vapor deposition process. The process of forming the second back transparent conductive film 132 comprises a deposition process, such as a plasma chemical vapor deposition process. The process of forming the third back transparent conductive film 133 comprises a deposition process, such as a plasma chemical vapor deposition process.

The process of forming the front composite transparent conductive film 130a comprises a deposition process, such as a plasma chemical vapor deposition process.

The material of the front composite transparent conductive film 130a comprises tungsten-doped indium oxide.

Figure 7:
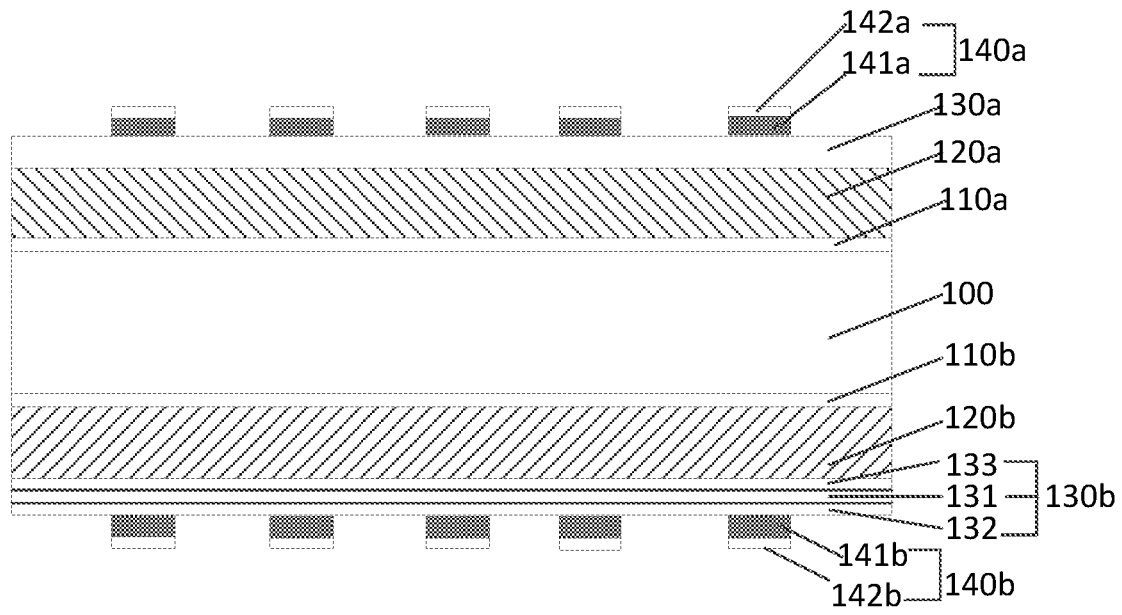

Referring to FIG. 7, a back grid line 140b is formed on the side of the back composite transparent conductive film 130b facing away from the semiconductor substrate layer 100; a front grid line 140a is formed on the side of the front composite transparent conductive film 130a facing away from the semiconductor substrate layer 100.

The step of forming the back grid line 140b comprises forming a patterned first photoresist layer on the surface of the back composite transparent conductive film 130b, the first photoresist layer has a first grid line opening: forming the back grid line in the first grid line opening by an evaporation process; removing the first photoresist layer after forming the back grid line 140b in the first grid line opening by the evaporation process.

The step of forming the first photoresist layer comprises coating a first photoresist film: curing the first photoresist film after coating the first photoresist film: exposing the first photoresist film after curing the first photoresist film: developing the first photoresist film to form the first photoresist layer after exposing the first photoresist film.

The process of removing the first photoresist layer comprises a demoulding process.

The step of forming a back grid line 140b in the first grid line opening by the evaporation process comprises: forming a first sub-back grid line 141b in the first grid line opening by the evaporation process; forming a second sub-back grid line 142b located on the surface of the first sub-back grid line 141b in the first grid line opening by the evaporation process: a conductivity of the first sub-back grid line 141b is greater than that of the second sub-back grid line 142b: a melting point of the second sub-back grid line 142b is less than that of the first sub-back grid line 141b.

The step of forming the front grid line 140a comprises forming a patterned second photoresist layer on the surface of the front composite transparent conductive film 130a, the second photoresist layer has a second grid line opening: forming the front grid line 140a in the second grid line opening by an evaporation process: removing the second photoresist layer after forming the front grid line 140a in the second grid line opening by the evaporation process.

The step of forming the second photoresist layer comprises coating a second photoresist film: curing the first photoresist film after coating the second photoresist film: exposing the second photoresist film after curing the second photoresist film: developing the second photoresist film to form the second photoresist layer after exposing the second photoresist film.

The process of removing the second photoresist layer comprises a demoulding process.

The step of forming a front grid line 140a in the second grid line opening by an evaporation process comprises forming a first sub-front grid line 141a in the second grid line opening by using an evaporation process: forming a second sub-back grid line 142a located on the surface of the first sub-back grid line 141a in the first grid line opening by an evaporation process: a conductivity of the first sub-front grid line 141a is greater than that of the second sub-front grid line 142a: a melting point of the second sub-front grid line 142a is less than that of the first sub-front grid line 141a.

In this embodiment, since the evaporation process is used to form the front grid line 140a, the bonding force between the front grid line 140a and the front composite transparent conductive film 130a is better, and the contact resistance between the front grid line 140a and the front composite transparent conductive film 130a is further reduced.

In this embodiment, since the evaporation process is used to form the back grid line 140b, the bonding force between the back grid line 140b and the back composite transparent conductive film 130b is better, and the contact resistance between the back grid line 140b and the back composite transparent conductive film 130b is further reduced.

In this embodiment, the method for preparing a heterojunction solar cell further comprises curing the front grid line 140a and the back grid line 140b; and performing light injection annealing process after curing the front grid line 140a and the back grid line 140b.

The light injection annealing process refers to using infrared light to irradiate the front grid line 140a and the back grid line 140b while performing the annealing process, so that the thermal shock to the front grid line 140a and the back grid line 140b is enhanced.

For the parameters of each film layer involved in the preparation method, refer to the corresponding content of the previous embodiment, and will not be described in detail.

Obviously, the above-mentioned embodiments are only examples to clearly illustrate the technical points of the present application, and are not intended to limit the implementation. For those of ordinary skill in the art, changes or modifications in other different forms can also be made on the basis of the above description. It is not necessary and impossible to exhaustively enumerate all implementations, and the obvious changes or modifications derived therefrom are still within the protection scope of the present invention.

The invention claimed is:

1. A heterojunction solar cell, comprising:
   a semiconductor substrate layer; and
   a back composite transparent conductive film located on one side of the semiconductor substrate layer,
   wherein the back composite transparent conductive film comprises:
   a first back transparent conductive film, and
   a second back transparent conductive film located on a surface of a side of the first back transparent conductive film facing away from the semiconductor substrate layer,
   wherein both the first back transparent conductive film and the second back transparent conductive film are doped with group III heavy atoms and a concentration of group III heavy atoms in the second back transparent conductive film is lower than that of the group III heavy atoms in the first back transparent conductive film,
   wherein the back composite transparent conductive film further comprises a third back transparent conductive film located between the first back transparent conductive film and the semiconductor substrate layer and a work function of the third back transparent conductive film is higher than that of the first back transparent conductive film and higher than that of the second back transparent conductive film, wherein mobility of the third back transparent conductive film is greater than that of the first back transparent conductive film and greater than that of the second back transparent conductive film, and wherein a concentration of doping ions in the third back transparent conductive film is lower than the concentration of group III heavy atoms in the first back transparent conductive film and lower than the concentration of group III heavy atoms in the second back transparent conductive film.

2. The heterojunction solar cell of claim 1, wherein the group III heavy atoms comprise gallium atoms, material of the first back transparent conductive film comprises gallium-doped zinc oxide, and material of the second back transparent conductive film comprises gallium-doped zinc oxide.

3. The heterojunction solar cell of claim 2, wherein a ratio of a mass percentage concentration of gallium in the second back transparent conductive film to a mass percentage concentration of gallium in the first back transparent conductive film is in a range from 1:2 to 1:4.

4. The heterojunction solar cell of claim 2, wherein mass percentage concentration of gallium in the first back transparent conductive film is in a range from 1.5% to 2% and mass percentage concentration of gallium in the second back transparent conductive film is in a range from 0.5%-1%.

5. The heterojunction solar cell of claim 2, wherein a ratio of a thickness of the second back transparent conductive film to a thickness of the first back transparent conductive film is in a range from 1:4 to 1:3.

6. The heterojunction solar cell of claim 2, wherein thickness of the second back transparent conductive film ranges from 10 nm to 20 nm and thickness of the first back transparent conductive film ranges from 50 nm to 60 nm.

7. The heterojunction solar cell of claim 1, wherein material of the third back transparent conductive film comprises tungsten-doped indium oxide.

8. The heterojunction solar cell of claim 7, wherein a mass percentage concentration of tungsten in the tungsten-doped indium oxide is in a range from 0.1% to 0.3%.

9. The heterojunction solar cell of claim 7, wherein a ratio of a thickness of the third back transparent conductive film to a thickness of the first back transparent conductive film is in a range from 1:5 to 1:6.

10. The heterojunction solar cell of claim 1, wherein:

the heterojunction solar cell further comprises a back grid line located on a side of the back composite transparent conductive film facing away from the semiconductor substrate layer, the back grid line comprises a first sub-back grid line and a second sub-back grid line located on a surface of a side of the first sub-back grid line that faces away from the semiconductor substrate layer, a conductivity of the first sub-back grid line is greater than a conductivity of the second sub-back grid line, and a melting point of the second sub-back grid line is lower than that of the first sub-back grid line.

11. The heterojunction solar cell of claim 10, wherein material of the first sub-back grid line comprises copper and material of the second sub-back grid line comprises tin.

12. The heterojunction solar cell of claim 10, wherein a relationship between a thickness of the first sub-back grid line and a thickness of the second sub-back grid line is in a range from 5:1 to 9:1.

13. The heterojunction solar cell of claim 10, wherein an aspect ratio of the back grid line ranges from 0.8:2 to 1:2, a width of the back grid line ranges from 9 μm to 11 μm, and a height of the back grid line ranges from 4 μm to 6 μm.

14. The heterojunction solar cell of claim 1, wherein the heterojunction solar cell further comprises a front composite transparent conductive film located on a side of the semiconductor substrate layer facing away from the back composite transparent conductive film and wherein material of the front composite transparent conductive film comprises tungsten-doped indium oxide.

15. A method for preparing a heterojunction solar cell, wherein the method comprises:

providing a semiconductor substrate layer; and forming a back composite transparent conductive film on one side of the semiconductor substrate layer, wherein a process for forming the back composite transparent conductive film comprises:

forming a first back transparent conductive film on one side of the semiconductor substrate layer, and forming a second back transparent conductive film on a surface of the side of the first back transparent conductive film facing away from the semiconductor substrate layer, wherein both the first back transparent conductive film and the second back transparent conductive film are doped with group III heavy atoms and a concentration of group III heavy atoms in the second back transparent conductive film is lower than that of the group III heavy atoms in the first back transparent conductive film, wherein the process for forming the back composite transparent conductive film further comprises forming a third back transparent conductive film on one side of the semiconductor substrate layer before forming a first back composite transparent conductive film, wherein the third back transparent conductive film is located between the first back transparent conductive film and the semiconductor substrate layer after forming the first back transparent conductive film, wherein a work function of the third back transparent conductive film is higher than that of the first back transparent conductive film and higher than that of the second back transparent conductive film, wherein a mobility of the third back transparent conductive film is greater than that of the first back transparent conductive film and greater than that of the second back transparent conductive film, and wherein a concentration of doping ions in the third back transparent conductive film is lower than that of group III heavy atoms in the first back transparent conductive film and lower than that of group III heavy atoms in the second back transparent conductive film.

16. The method for preparing a heterojunction solar cell of claim 15, wherein the method for preparing a heterojunction solar cell further comprises forming a front composite transparent conductive film on a side of the semiconductor substrate layer facing away from the back composite transparent conductive film and wherein material of the front composite transparent conductive film comprises tungsten-doped indium oxide.

*  *  *  *  *